US012787655B2

(12) United States Patent
Lee et al.

(10) Patent No.: US 12,787,655 B2
(45) Date of Patent: Nov. 3, 2026

(54) METHOD OF MANUFACTURING MAGNETORESISTIVE RANDOM ACCESS MEMORY DEVICE

(71) Applicant: SAMSUNG ELECTRONICS CO., LTD., Suwon-si (KR)

(72) Inventors: Kilho Lee, Suwon-si (KR); Yongjae Kim, Suwon-si (KR); Kiseok Suh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 330 days.

(21) Appl. No.: 18/671,519

(22) Filed: May 22, 2024

(65) Prior Publication Data

US 2025/0151627 A1 May 8, 2025

(30) Foreign Application Priority Data

Nov. 3, 2023 (KR) ........................ 10-2023-0151150

(51) Int. Cl.
*H10N 50/01* (2023.01)
*H10B 61/00* (2023.01)
*H10N 50/10* (2023.01)

(52) U.S. Cl.
CPC ............. *H10N 50/01* (2023.02); *H10B 61/00* (2023.02); *H10N 50/10* (2023.02)

(58) Field of Classification Search
CPC ........ H10N 50/01; H10N 50/10; H10N 50/80; H10B 61/00; H10B 61/22; H10B 61/10
See application file for complete search history.

(56) References Cited

U.S. PATENT DOCUMENTS

| | | | | |
|---|---|---|---|---|
| 9,905,753 | B2 * | 2/2018 | Lee | H10N 50/85 |
| 10,163,478 | B2 | 12/2018 | Jung et al. | |
| 10,522,752 | B1 | 12/2019 | Jan et al. | |
| 11,121,173 | B2 | 9/2021 | Dutta et al. | |
| 2013/0058161 | A1 * | 3/2013 | Yamanaka | G11C 11/5607 257/E21.665 |
| 2013/0058162 | A1 * | 3/2013 | Yamanaka | H10B 61/22 257/E21.665 |
| 2017/0110657 | A1 * | 4/2017 | Park | G11C 11/1659 |
| 2018/0342669 | A1 | 11/2018 | Kim et al. | |
| 2019/0165262 | A1 * | 5/2019 | Kim | H10B 61/22 |
| 2021/0313394 | A1 | 10/2021 | Kalnitsky et al. | |
| 2025/0089578 | A1 * | 3/2025 | Xiao | H10N 50/01 |

* cited by examiner

*Primary Examiner* — Dao H Nguyen
(74) *Attorney, Agent, or Firm* — Morgan, Lewis & Bockius LLP

(57) ABSTRACT

A method of manufacturing a magnetoresistive memory device includes: forming, sequentially, a magnetic tunnel junction (MTJ) structure and a metal layer on a substrate in first and second cell regions; performing a first oxidation process on the metal layer in the first and second cell regions to form a first metal oxide layer; performing an ion implantation process on the first metal oxide layer in the first cell region to form a second metal oxide layer while the first metal oxide layer is exposed in the second cell region; and patterning the MTJ structure, the first and second metal oxide layers to form a first memory element including a first MTJ structure and the second metal oxide layer in the first cell region, and to form a second memory element including a second MTJ structure and the first metal oxide layer in the second cell region.

20 Claims, 18 Drawing Sheets

METHOD OF MANUFACTURING MAGNETORESISTIVE RANDOM ACCESS MEMORY DEVICE

CROSS-REFERENCE TO RELATED APPLICATION(S)

This application claims priority under 35 U.S.C. § 119 to Korean Patent Application No. 10-2023-0151150 filed on Nov. 3, 2023, in the Korean Intellectual Property Office, the disclosure of which is herein incorporated by reference in its entirety.

TECHNICAL FIELD

The present disclosure relates to a method of manufacturing a magnetoresistive random access memory device.

DESCRIPTION OF RELATED ART

A magnetic resistance memory device is a nonvolatile memory device configured to read and write data using a magnetic tunnel junction (MTJ) layer including two magnetic layers and a tunnel barrier layer interposed therebetween. An electrical resistance value of the magnetic tunnel junction layer may vary depending on a magnetization direction of the two magnetic layers. For example, the electrical resistance of the magnetic tunnel junction may be higher when magnetization directions of the magnetic layers are anti-parallel to each other as compared to when the magnetization directions of the magnetic layers are parallel to each other. Such a difference in electrical resistance can be used for data storing data in the magnetic memory device.

SUMMARY

An aspect of the present disclosure provides a method of manufacturing a magnetoresistive memory device having improved electrical characteristics.

According to an aspect of the present disclosure, a method of manufacturing a magnetoresistive memory device is provided including: forming, sequentially, a magnetic tunnel junction structure and a metal layer on a substrate including a first cell region and a second cell region; performing a first oxidation process on the metal layer in the first cell region and the second cell region to form a first metal oxide layer; performing an ion implantation process on the first metal oxide layer in the first cell region to form a second metal oxide layer while the first metal oxide layer is exposed in the second cell region; and patterning the magnetic tunnel junction structure, the first metal oxide layer and the second metal oxide layer to form a first memory element including a first magnetic tunnel junction structure and the second metal oxide layer in the first cell region, and forming a second memory element including a second magnetic tunnel junction structure and the first metal oxide layer in the second cell region.

According to an aspect of the present disclosure, a method of manufacturing a magnetoresistive memory device is provided including: forming, sequentially, a magnetic tunnel junction structure and a metal layer on a substrate in a first cell region and a second cell region; performing a first oxidation process on the metal layer in the first cell region and the second cell region to form a first metal oxide layer; performing a second oxidation process on the first metal oxide layer in the first cell region to form a second metal oxide layer; and patterning the magnetic tunnel junction structure and the first metal oxide layer and the second metal oxide layer to form a first memory element including a first magnetic tunnel junction structure and the second metal oxide layer in the first cell region, and to form a second memory element including a second magnetic tunnel junction structure and the first metal oxide layer in the second cell region, wherein an oxygen concentration of the first memory element is different from an oxygen concentration of the second memory element.

According to an aspect of the present disclosure, a method of manufacturing a magnetoresistive memory device is provided including: forming, sequentially, a magnetic tunnel junction structure and a metal layer on a substrate in a first cell region and a second cell region; performing a first oxidation process on the first cell region and the second cell region; performing, selectively, a second oxidation process on the first cell region; and patterning the magnetic tunnel junction structure to form a first magnetic tunnel junction structure in the first cell region and form a second magnetic tunnel junction structure in the first cell region and the second cell region, wherein a first memory element, formed in the first cell region and including the first magnetic tunnel junction structure, and a second memory element, formed in the second cell region and including the second magnetic tunnel junction structure, have different electrical characteristics.

A method of manufacturing a magnetoresistive memory device having improved electrical characteristics may be provided by performing a selective oxidation process on at least one of a plurality of regions.

Advantages and effects of the present application are not limited to the foregoing content and may be more easily understood in the process of describing a specific example embodiment of the present disclosure.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1A:
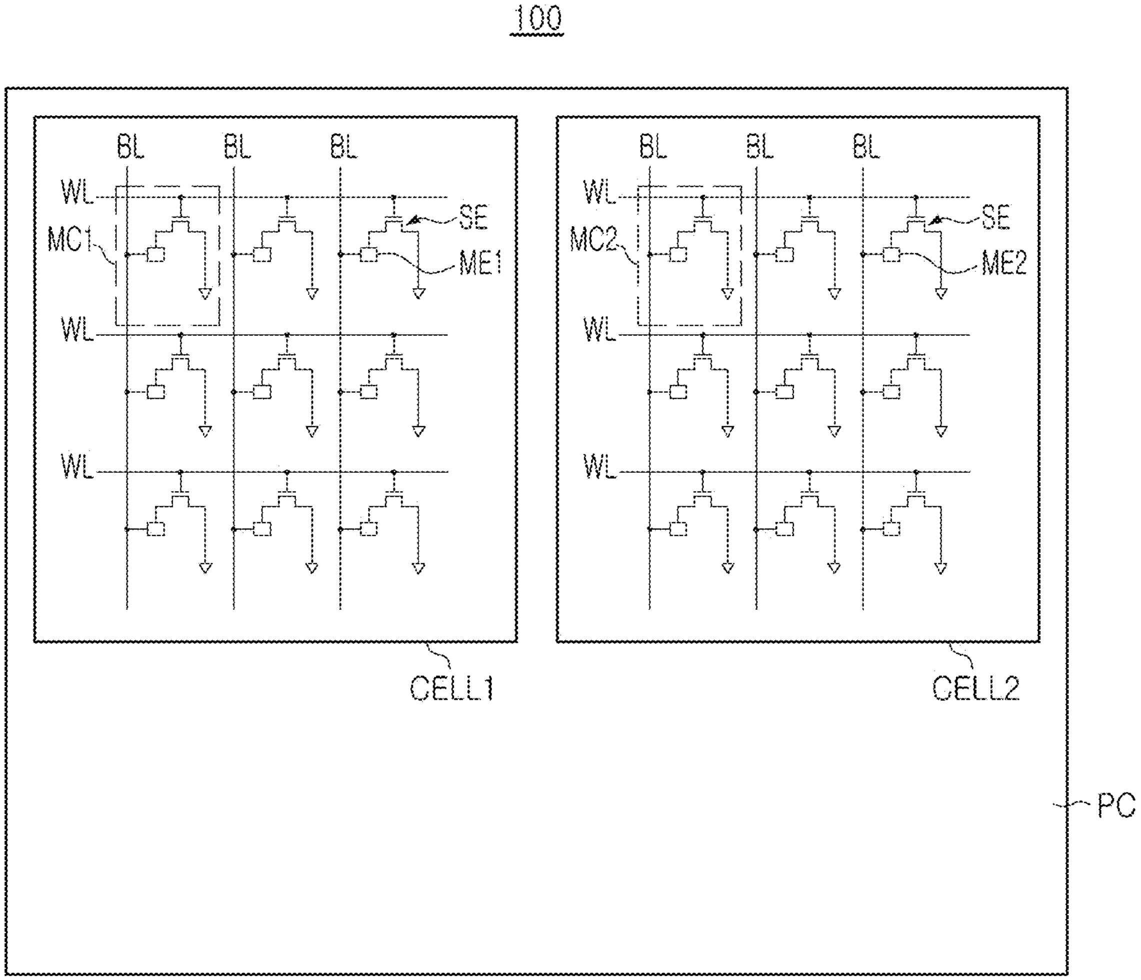
FIG. 1A is a schematic plan view of a magnetoresistive memory device according to example embodiments.

In the following detailed description, reference is made to the accompanying drawings that show, by way of illustration, embodiments in which the invention may be practiced. Embodiments are described in sufficient detail to enable those skilled in the art to practice the invention. It is to be understood that various embodiments of the invention, although different, are not necessarily mutually exclusive. For example, a certain feature, structure, or characteristic described herein in connection with one embodiment may be implemented within other embodiments without departing from the spirit and scope of the invention. In addition, it is to be understood that the location or arrangement of individual elements within each embodiment may be modified without departing from the spirit and scope of the invention. The following detailed description is, therefore, not to be taken in a limiting sense, and the scope of the present inventive concept is defined only by the appended claims, appropriately interpreted, along with the full range of equivalents to which the claims are entitled. In the drawings, like numerals refer to the same or similar elements or functionality throughout the several views.

Hereinafter, example embodiments of the present disclosure will be described with reference to the accompanying drawings.

Figure 1B:
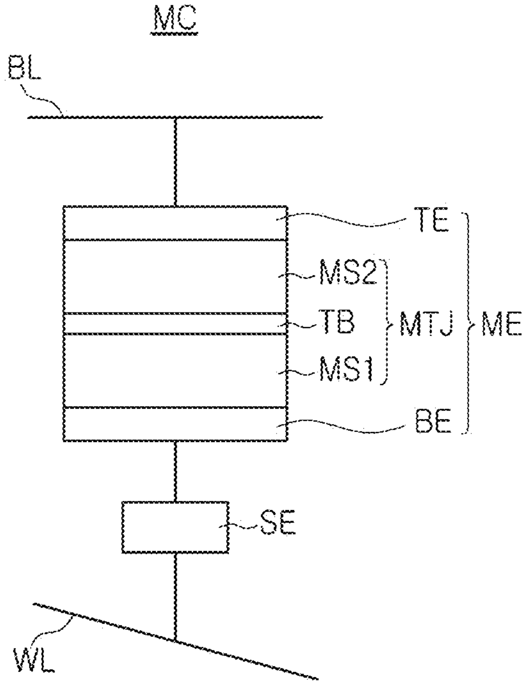
FIG. 1B is a view illustrating a unit memory cell of a magnetoresistive memory device according to example embodiments.

FIG. 1A is a schematic plan view of a magnetoresistive memory device according to example embodiments. FIG. 1B is a view illustrating a unit memory cell of a magnetoresistive memory device according to example embodiments.

Referring to FIG. 1A, a magnetic resistive random access memory (MRAM) 100 may include a first cell region CELL1, a second cell region CELL2 and a peripheral circuit region PC. The first cell region CELL1 may include a first memory cell MC1. The second cell region CELL2 may include a second memory cell MC2. The first memory cell MC1 may be repetitively implemented and instances thereof may be two-dimensionally or three-dimensionally disposed. The second memory cell MC2 may be repetitively implemented and instances thereof may be two-dimensionally or three-dimensionally disposed. The peripheral circuit region PC may include circuit elements for operating the first and second cell regions CELL1 and CELL2.

The first memory cells MC1 may have different electrical characteristics from those of the second memory cells MC2. For example, the first memory cells MC1 may have relatively high retention characteristics, and the second memory cells MC2 may have relatively high speed characteristics. Accordingly, the first cell region CELL1 may have similar characteristics to those of a flash memory, and the second cell region CELL2 may have similar characteristics to those of a static random access memory (SRAM) memory. In an example embodiment, the magnetoresistive memory device 100 is described as including two cell regions, but the number of cell regions included in the magnetoresistive memory device 100 is not limited thereto, and the magnetoresistive memory device 100 may include a plurality of cell regions having different electrical characteristics.

Each of the first memory cells MC1 may include a first magnetic memory element ME1 and a selection element SE. Each of the second memory cells MC2 may include a second memory element ME2 and a selection element SE. The first and second memory elements ME1 and ME2 may be connected between a bit line BL and the selection element SE, respectively. The selection element SE may be connected between each of the first and second memory elements ME1 and ME2 and a word line WL. In some example embodiments, the selection element SE may be connected to a separate interconnection, for example, a source line.

The first and second cell regions CELL1 and CELL2 may or may not share circuit elements of the peripheral circuit region PC. In a case where the first and second cell regions CELL1 and CELL2 do not share circuit elements of the peripheral circuit region PC, the peripheral circuit region PC may include a first region for driving the first cell region CELL1 and a second region for driving the second cell region CELL2.

Referring to FIG. 1B, a memory cell MC including the first memory cell MC1 or the second memory cell MC2 is illustrated in detail. A memory element ME may include a magnetic tunnel junction structure MTJ, a lower electrode BE, and an upper electrode TE. The magnetic tunnel junction structure MTJ may be a variable resistance element that may be switched to two resistance states by an electrical pulse applied thereto. The magnetic tunnel junction structure MTJ may include at least one ferromagnetic material and/or at least one antiferromagnetic material. Specifically, the magnetic tunnel junction structure MTJ may include a first magnetic layer MS1, a second magnetic layer MS2, and a tunnel barrier layer TB disposed between the first magnetic layer MS1 and the second magnetic layer MS2. Each of the first and second magnetic layers MS1 and MS2 may include at least one magnetic layer formed of a magnetic material. A lower electrode BE may be interposed between the first magnetic layer MS1 and the selection element SE, and an upper electrode TE may be interposed between the second magnetic layer MS2 and the bit line BL.

The selection element SE may be configured to selectively control a flow of electric charges passing through the memory element ME. For example, the selection element SE may be a diode, a bipolar transistor, or a field effect transistor. When the selection element SE is formed of a bipolar transistor or a field effect transistor that is a three-terminal element, an additional interconnection may be connected to the selection element SE.

Figure 2:
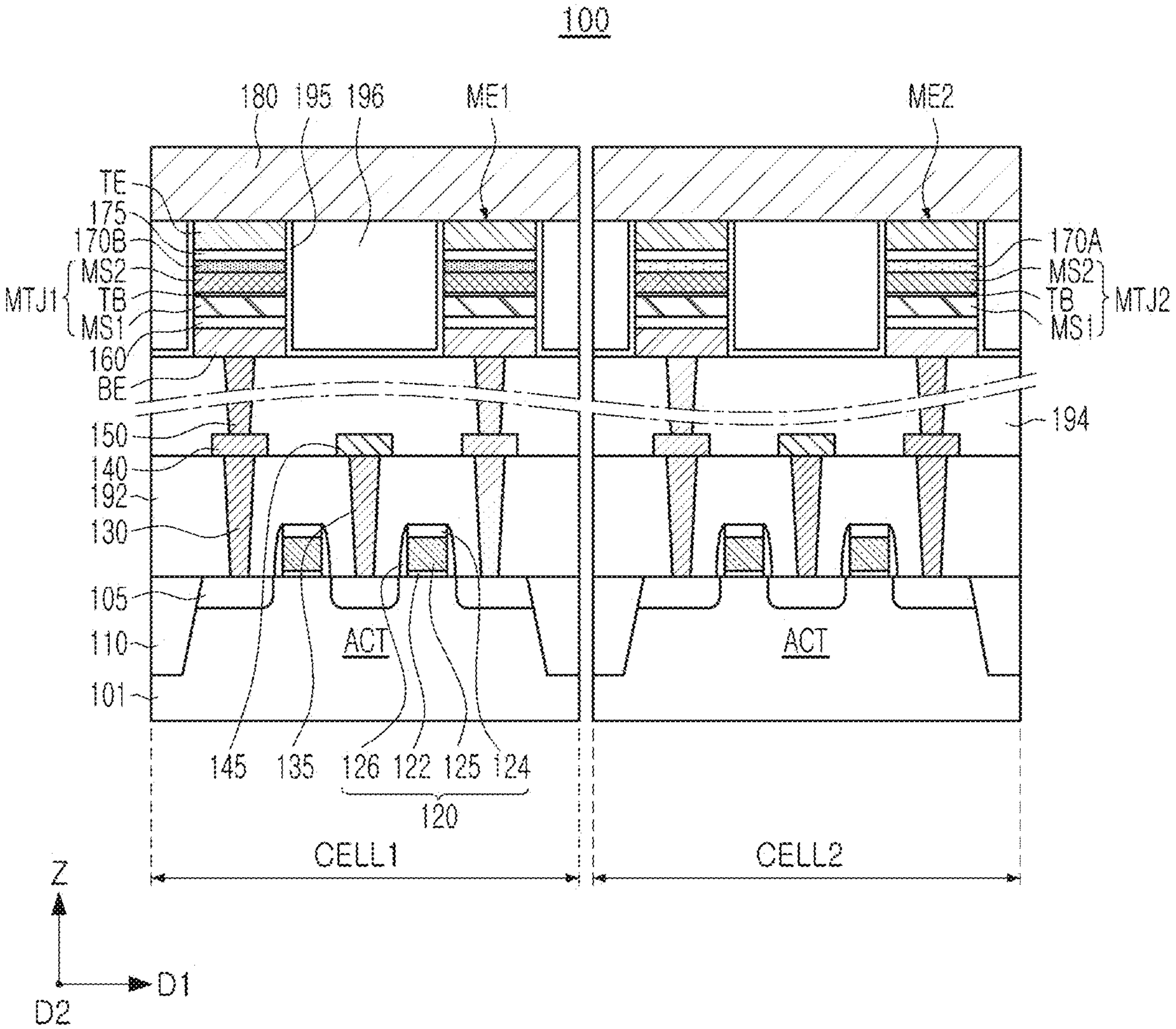
FIG. 2 is a schematic cross-sectional view of a magnetoresistive memory device according to example embodiments.

FIG. 2 is a schematic cross-sectional view of a magnetoresistive memory device according to example embodiments.

Referring to FIG. 2, a magnetoresistive memory device 100 may include a substrate 101, a plurality of gate structures 120, a first contact plug 130, a second contact plug 135, and a third contact plug 150. The plurality of gate structures 120 and the first to third contact plugs 130, 135, and 150 may be disposed on the substrate 101. The magnetoresistive memory device 100 may include a first interconnection 140 and a second interconnection 145, a plurality of lower electrodes BE, a plurality of seed layers 160 disposed on the lower electrodes BE, a first magnetic tunnel junction structure MTJ1 and a second magnetic tunnel junction structure MTJ2. The first and second magnetic tunnel junction structures MTJ1 and MTJ2 may be disposed on the seed layers 160. The magnetoresistive memory device 100 may include a first metal oxide layer 170A disposed on the first magnetic tunnel junction structure MTJ1 and a second metal oxide layer 170B disposed on the second magnetic tunnel junction structure MTJ2. The magnetoresistive memory device 100 may include a plurality of capping layers 175 disposed on the first and second metal oxide layers 170A and 170B, a plurality of upper electrodes TE disposed on the capping layers 175, and a plurality of bit lines 180 connected to the upper electrodes TE. The magnetoresistive memory device 100 may further include a plurality of active regions ACT defined in the substrate 101, a plurality of device isolation layers 110 defining the active regions ACT, a plurality of impurity regions 105 in the substrate 101, a first interlayer insulating layer 192, a second interlayer insulating layer 194, a third interlayer insulating layer 196, and a plurality of passivation layers 195. The magnetoresistive memory device 100 may include a first cell region CELL1 and a second cell region CELL2 as described with reference to FIG. 1A, and the first magnetic tunnel junction structures MTJ1 may be disposed in the first cell region CELL1, and the second magnetic tunnel junction structures MTJ2 may be disposed in the second cell region CELL2.

The substrate 101 may have an upper surface extending in a first direction D1 and a second direction D2. The active regions ACT may be defined in the substrate 101 by the device isolation layers 110. For example, the active regions ACT may be disposed between the device isolation layers 110. Impurity regions 105 including impurities may be disposed in a portion of the active region ACT. Impurity regions 105 may be disposed in an upper portion of the active region ACT. The impurity regions 105 may function as, for example, source/drain regions of transistors including the gate structures 120. The substrate 101 may include a semiconductor material, for example, a group IV semiconductor, a group III-V compound semiconductor, or a group II-VI compound semiconductor. The substrate 101 may be provided as a bulk wafer or an epitaxial layer.

The device isolation layers 110 may be formed of an insulating material. The device isolation layers 110 may be formed by, for example, a shallow trench isolation (STI) process. The device isolation layers 110 may include, for example, an oxide or a nitride, or a combination thereof.

The gate structures 120 may extend in a direction, for example, in the second direction D2, on the substrate 101. Each of the gate structures 120 may include a gate dielectric layer 122, a gate electrode 125, a plurality of gate spacers 126, and a gate capping layer 124. The gate dielectric layer 122 may include an insulating material, for example, a silicon oxide or a high dielectric constant material. The gate electrode 125 may be disposed on the gate dielectric layer 122 and may form, for example, a gate of the selection element SE of FIG. 1B. The gate electrode 125 may include a conductive material such as a metal, a metal nitride, or a doped polysilicon. The gate spacers 126 may be disposed on side surfaces of each of the gate dielectric layer 122, the gate electrode 125, and the gate capping layer 124. For example, the gate spacers 126 may cover side surfaces of each of the gate dielectric layer 122, the gate electrode 125, and the gate capping layer 124. The gate capping layer 124 may be disposed on the gate electrode 125. Each of the gate spacers 126 and the gate capping layer 124 may include an insulating material, for example, silicon oxide, silicon nitride, or silicon oxynitride.

In some example embodiments, gate structures 120 may have a shape buried in the substrate 101, and for example, the gate structures 120 may have a structure of a buried channel array transistor (BCAT), or have shapes of a recessed channel array transistor (RCAT) or a sphere-shaped recess channel array transistor (SRCAT).

The first and second contact plugs 130 and 135 may be disposed at both sides of the gate structures 120. The first and second contact plugs 130 and 135 may connect the impurity regions 105 to the first and second interconnections 140 and 145, respectively. The first and second interconnections 140 and 145 may be disposed on upper portions of the first and second contact plugs 130 and 135, respectively. The second interconnections 145 may form, for example, a source line of the selection element SE of FIG. 1B. The third contact plug 150 may be disposed on the first interconnection 140. The third contact plug 150 may be electrically connected to the first interconnection 140. In a region not illustrated, a contact plug may also be electrically connected on the second interconnections 145. Interconnections and contact plugs may be disposed in a plurality of layers in a vertical direction, for example, in a Z-direction, between the first and second interconnections 140 and 145 and the lower electrodes BE.

The first to third contact plugs 130, 135 and 150 and the first and second interconnections 140 and 145 may include a conductive material, for example, at least one of doped silicon, tungsten (W), aluminum (Al), titanium (Ti), tantalum (Ta), titanium nitride (TiN), tantalum nitride (TaN), tungsten nitride (WN), or metal silicide.

Each of the first memory elements ME1 may include a lower electrode BE and an upper electrode TE. Each of the first memory elements ME1 may further include a seed layer 160, a first magnetic tunnel junction structure MTJ1, a second metal oxide layer 170B, and a capping layer 175, sequentially stacked between the lower electrode BE and the upper electrode TE. Each of the second memory elements ME2 may include a lower electrode BE and an upper electrode TE. Each of the second memory elements ME2 may further include a seed layer 160, a second magnetic tunnel junction structure MTJ2, a first metal oxide layer 170A, and a capping layer 175, sequentially stacked between the lower electrode BE and the upper electrode TE.

The lower electrode BE and the upper electrode TE may include a conductive material such as titanium (Ti), tantalum (Ta), ruthenium (Ru), titanium nitride (TiN), tantalum nitride (TaN), or tungsten (W).

The seed layer 160 may contribute to the growth of the first and second magnetic tunnel junction structures MTJ1 and MTJ2 in the upper portion. The seed layer 160 may be a layer for securing crystallinity of the first and second magnetic tunnel junction structures MTJ1 and MTJ2. The seed layer 160 may include, for example, at least one of tantalum (Ta) or ruthenium (Ru), or alloys thereof. In some example embodiments, the seed layer 160 may be omitted.

Each of the first and second magnetic tunnel junction structures MTJ1 and MTJ2 may include a first magnetic layer MS1, a tunnel barrier layer TB, and a second magnetic layer MS2. The first magnetic layer MS1 may be a fixed layer having a fixed magnetization direction, and the second magnetic layer MS2 may be a free layer whose magnetization direction may be freely changed due to an external magnetic field. The first and second magnetic layers MS1 and MS2 may have a magnetization direction in a direction, parallel to, or perpendicular to an upper surface of the substrate 101. The first magnetic layer MS1 may have a magnetization direction that is changeable in a parallel direction or an anti-parallel direction with respect to the second magnetic layer MS2.

The first and second magnetic layers MS1 and MS2 may include a magnetic material including a transition metal. The first and second magnetic layers MS1 and MS2 may include, for example, at least one of cobalt (Co), iron (Fe), and nickel (Ni), and may further include other elements, for example, boron (B), chromium (Cr), platinum (Pt), or palladium (Pd), or the like. For example, the first and second magnetic layers MS1 and MS2 may include at least one of boron cobalt iron (CoFeB), iron cobalt (CoFe), nickel iron (NiFe), cobalt iron platinum (CoFePt), cobalt iron palladium (CoFePd), cobalt iron chromium (CoFeCr), cobalt iron terbium (CoFeTb), cobalt iron gadolinium (CoFeGd), cobalt iron nickel (CoFeNi), cobalt iron (CoFe), or nickel iron (NiFe). In some example embodiments, each of the first and second magnetic layers MS1 and MS2 may be comprised of a plurality of layers.

The tunnel barrier layer TB may be interposed between the first and second magnetic layers MS1 and MS2, and a quantum tunneling phenomenon may occur in the tunnel barrier layer TB. The tunnel barrier layer TB may include a metal oxide having insulating properties. For example, the tunnel barrier layer TB may include magnesium oxide (MgO) or aluminum oxide (AlO), or a combination thereof.

The first and second metal oxide layers 170A and 170B may improve magnetic properties of the first and second magnetic tunnel junction structures MTJ1 and MTJ2. The first and second metal oxide layers 170A and 170B may induce, for example, the second magnetic layer MS2 to have a vertical magnetization direction. The first and second metal oxide layers 170A and 170B may include a metal oxide, and may include at least one of, for example, tantalum oxide (TaO), ruthenium oxide (RuO), magnesium oxide (MgO), zirconium oxide (ZrO), titanium oxide (TiO), vanadium oxide (VO), yttrium oxide (YO), scandium oxide (ScO), or molybdenum oxide (MoO).

The first metal oxide layer 170A may form the second memory element ME2, and the second metal oxide layer 170B may form the first memory element ME1. The second metal oxide layer 170B may include a same metal material as the first metal oxide layer 170A. The second metal oxide layer 170B may have higher oxygen concentration than the first metal oxide layer 170A. For example, the second metal oxide layer 170B may be a layer formed by performing an additional oxidation process on the first metal oxide layer 170A. An example oxidation process is described in more detail below with reference to FIG. 5, FIGS. 6A to 6D, FIG. 7, FIG. 8A, FIG. 8B, and FIGS. 9A to 9E. The second metal oxide layer 170B may more strongly induce vertical magnetization of the second magnetic layer MS2 than the first metal oxide layer 170A. In some example embodiments, the first magnetic tunnel junction structure MTJ1 may include oxygen at a higher concentration than the second magnetic tunnel junction structure MTJ2. Accordingly, the first and second memory elements ME11 and ME2 of the first and second cell regions CELL1 and CELL2 may have different oxygen concentrations, and may have different electrical characteristics as described with reference to FIG. 1A. For example, the first memory elements ME1 may have MRAM characteristics similar to a flash memory, and the second memory elements ME2 may have MRAM characteristics similar to a SRAM.

The capping layer 175 may be a layer protecting the first and second magnetic tunnel junction structures MTJ1 and MTJ2. The capping layer 175 may include a metal material, a metal oxide, or a magnetic material. For example, the capping layer 175 may include tantalum (Ta) or ruthenium (Ru). In some example embodiments, the capping layer 175 may be omitted.

The first interlayer insulating layer 192 may be disposed on the gate structures 120 and the substrate 101. The second interlayer insulating layer 194 may be disposed on the first and second interconnections 140 and 145. The third interlayer insulating layer 196 may be disposed in spaces between the first and second memory elements ME1 and ME2. The third interlayer insulating layer 196 may fill the spaces between the first and second memory elements ME1 and ME2. The passivation layers 195 may be disposed on side surfaces of the first and second memory elements ME1 and ME2 and may extend along an upper surface of the second interlayer insulating layer 194. The passivation layers 195 may inhibit or prevent oxidation of the first and second magnetic layers MS1 and MS2.

The first to third interlayer insulating layers 192, 194 and 196 and the passivation layers 195 may include an insulating material, for example, silicon oxide, silicon nitride, silicon carbide, or silicon oxynitride. In some example embodiments, the passivation layers 195 may include a metal oxide, such as aluminum oxide (AlO).

The bit lines 180 may be disposed in contact with the upper electrodes TE. The bit lines 180 may extend in a direction, for example, in a first direction D1. The bit lines 180 may be formed of metal having a low resistivity, and may include, for example, copper (Cu) or tungsten (W). The bit lines 180 may further include a barrier layer.

Figure 3:
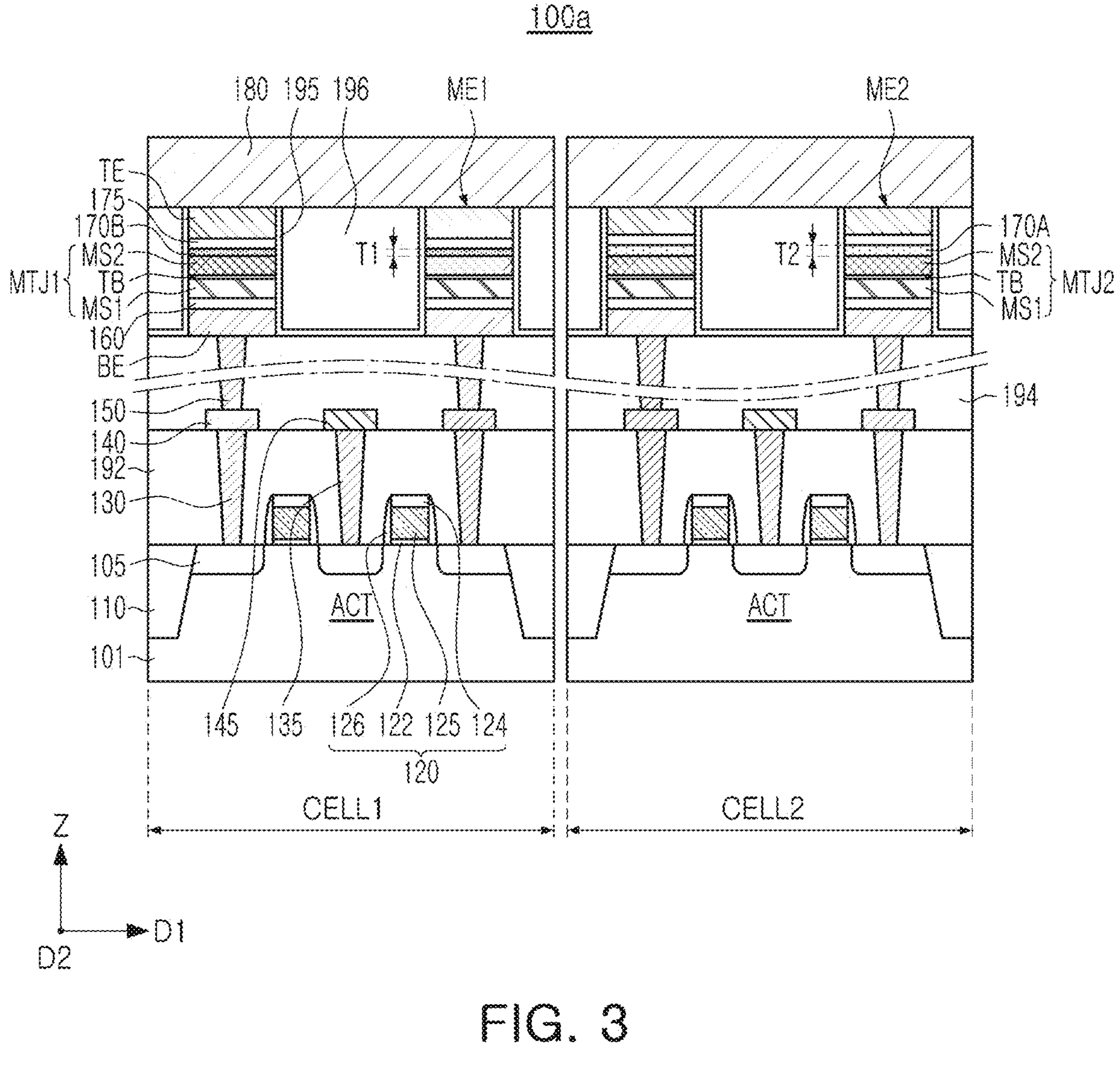
FIG. 3 is a schematic cross-sectional view of a magnetoresistive memory device according to example embodiments.
Figure 4:
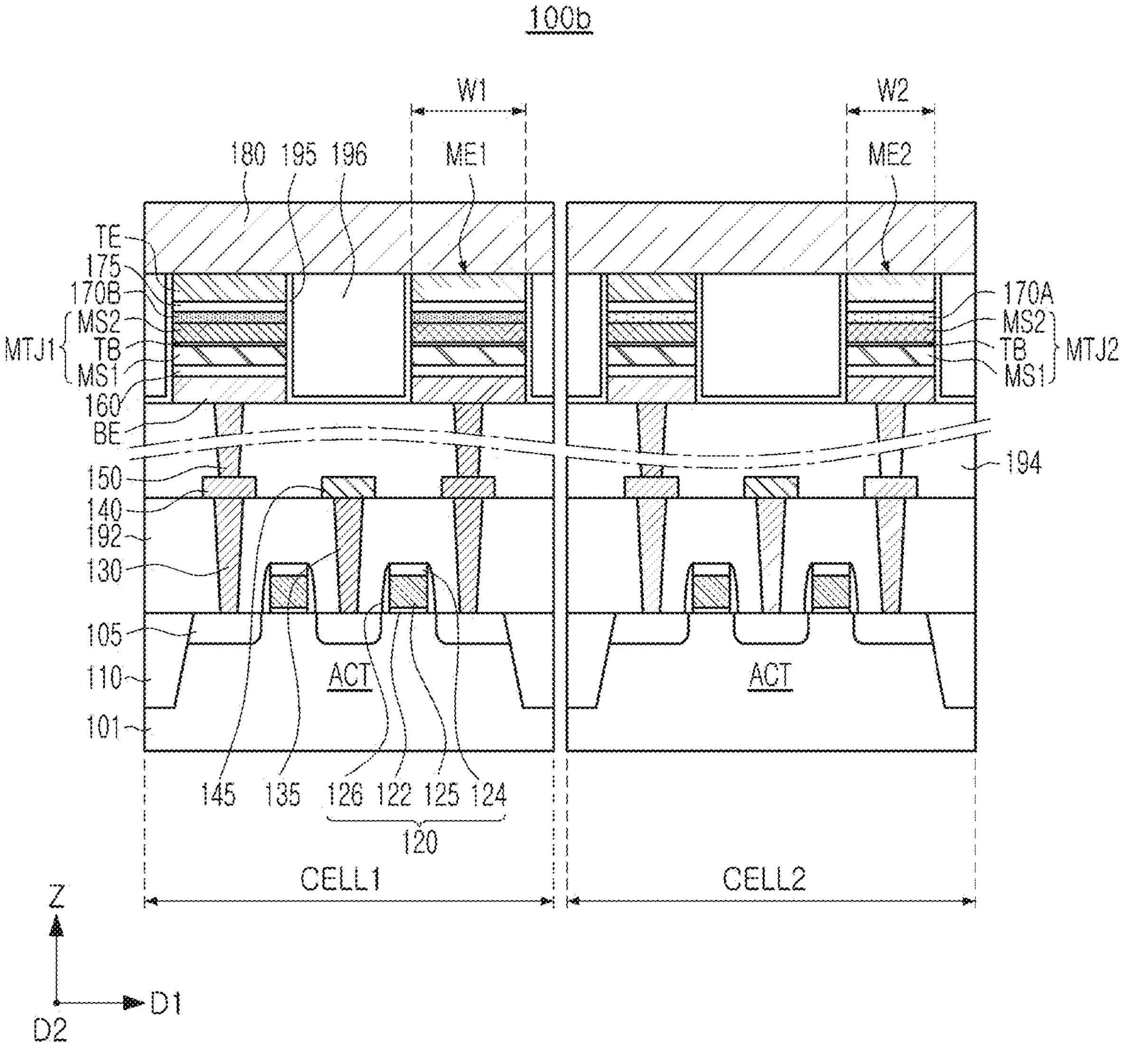
FIG. 4 is a schematic cross-sectional view of a magnetoresistive memory device according to example embodiments.

FIG. 3 and FIG. 4 are schematic cross-sectional views of a magnetoresistive memory device according to example embodiments.

Referring to FIG. 3, in a magnetoresistive memory device 100*a*, a first thickness T1 of a second metal oxide layer 170B forming first memory elements ME1 may be less than a second thickness T2 of a first metal oxide layer 170A forming the second memory elements ME2. For example, levels of lower surfaces of the first metal oxide layer 170A and the second metal oxide layer 170B may be substantially the same and levels of upper surfaces thereof may be different from each other. For example, a level of the upper surface of the second metal oxide layer 170B may be lower than a level of the upper surface of the first metal oxide layer 170A. Such a thickness difference may be, for example, based on a manufacturing method described with reference to FIGS. 9A to 9E below.

Referring to FIG. 4, in a magnetoresistive memory device 100*b*, a first width W1 of a first memory element ME1 may be greater than a second width W2 of a second memory element ME2. A size of the first memory element ME1, e.g., a planar area thereof, may be larger than a planar area of the second memory element ME2. In this case, the first memory element ME1 and the second memory element ME2 may have perpendicular magnetic anisotropies different from each other. Accordingly, data retention characteristics of the first memory element ME1 may be improved, and high-speed characteristics of the second memory element ME2 may be enhanced.

Figure 5:
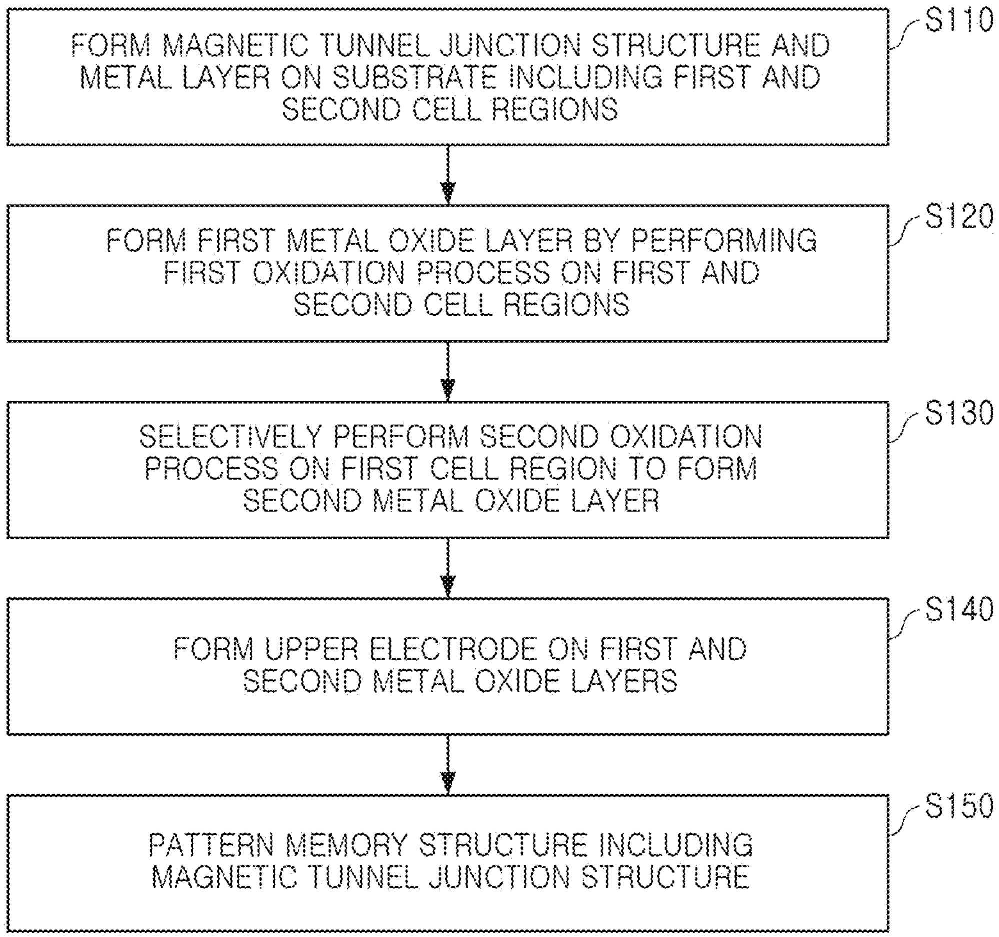
FIG. 5 is a flowchart illustrating a method of manufacturing a magnetoresistive memory device according to example embodiments.

FIG. 5 is a flowchart illustrating a method of manufacturing a magnetoresistive memory device according to example embodiments.

FIGS. 6A to 6D are schematic cross-sectional views illustrating a method of manufacturing a magnetoresistive memory device according to example embodiments. FIGS. 6A to 6D respectively illustrate regions corresponding to FIG. 2.

Figure 7:
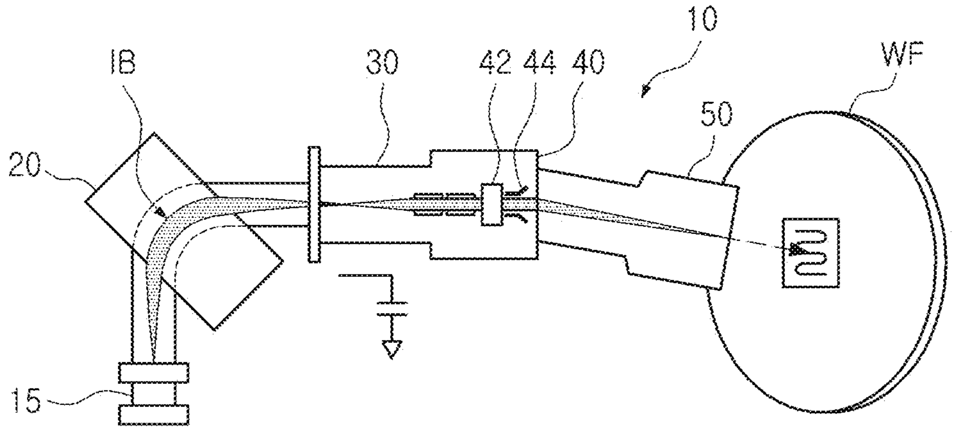
FIG. 7 is a schematic view of an ion implantation device used in a method of manufacturing a magnetoresistive memory device according to example embodiments.

FIG. 7 is a schematic view of an ion implantation device used in a method of manufacturing a magnetoresistive memory device according to example embodiments.

Figure 6A:
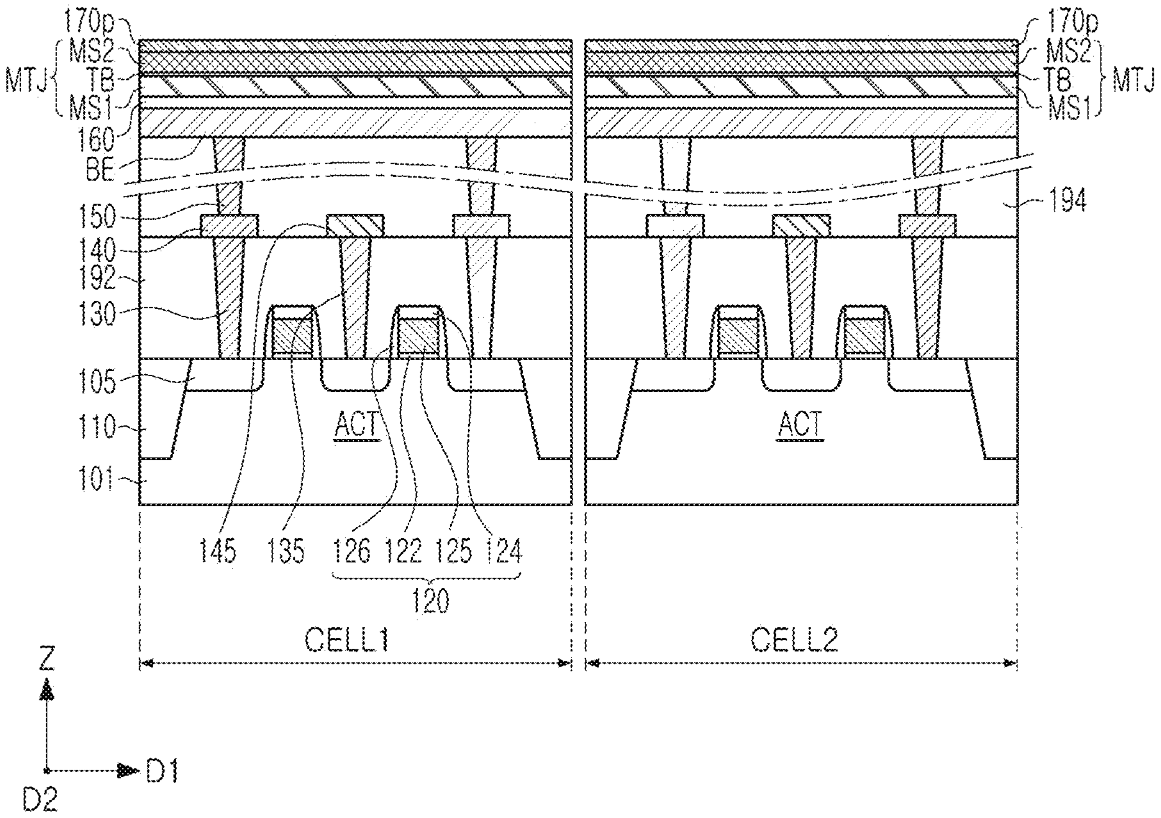
FIGS. 6A to 6D are schematic cross-sectional views illustrating a method of manufacturing a magnetoresistive memory device according to example embodiments.

Referring to FIG. 5 and FIG. 6A, a magnetic tunnel junction structure MTJ and a metal layer 170*p* may be formed on a substrate 101 including first and second cell regions CELL1 and CELL2 (S110).

The device isolation layers 110 may be formed in the substrate 101, and may define the active regions ACT. The impurity regions 105 may be formed in the substrate 101 by implanting impurities therein. The first and second cell regions CELL1 and CELL2 may be referred to as regions of a manufactured magnetoresistive memory device, but may also be referred to as regions of the substrate 101.

The gate structures 120 may be formed on the substrate 101. The first interlayer insulating layer 192 and the first and second contact plugs 130 and 135 may be formed on the substrate. The first and second interconnections 140 and 145 and the third contact plugs 150 may be formed on the first interlayer insulating layer 192, and interconnections forming wiring structures and contact plugs may be further formed.

The lower electrode BE, the magnetic tunnel junction structures MTJ, and the metal layer 170*p* may be sequentially formed on the second interlayer insulating layer 194. The metal layer 170*p* may include at least one of tantalum (Ta), ruthenium (Ru), magnesium (Mg), zirconium (Zr), titanium (Ti), vanadium (V), yttrium (Y), scandium (Sc), or molybdenum (Mo). In some example embodiments, the metal layer 170*p* may include at least one of tantalum (Ta), ruthenium (Ru), or magnesium (Mg).

Figure 6B:
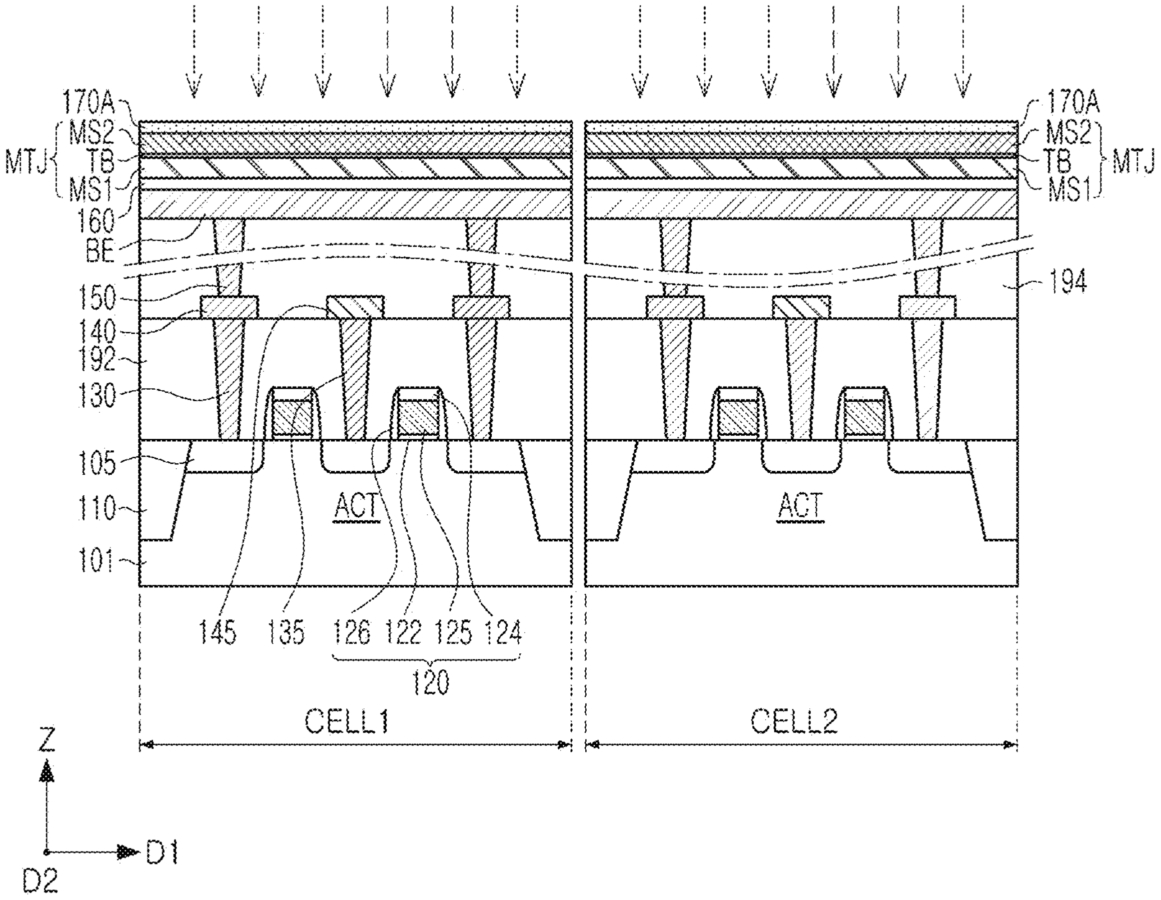

Referring to FIG. 5, FIG. 6A, and FIG. 6B, the first metal oxide layer 170A may be formed by performing a first oxidation process on the first and second cell regions CELL1 and CELL2 (S120).

The first oxidation process may be performed on the first and second cell regions CELL1 and CELL2, and the metal layer 170*p* may be oxidized to form the first metal oxide layer 170A. The first oxidation process may be, for example, a thermal oxidation process or a chemical vapor deposition (CVD), but the present disclosure is not limited thereto. According to example embodiments, a second magnetic layer MS2 may be partially oxidized at an interface with the metal layer 170*p* during the first oxidation process.

Figure 6C:
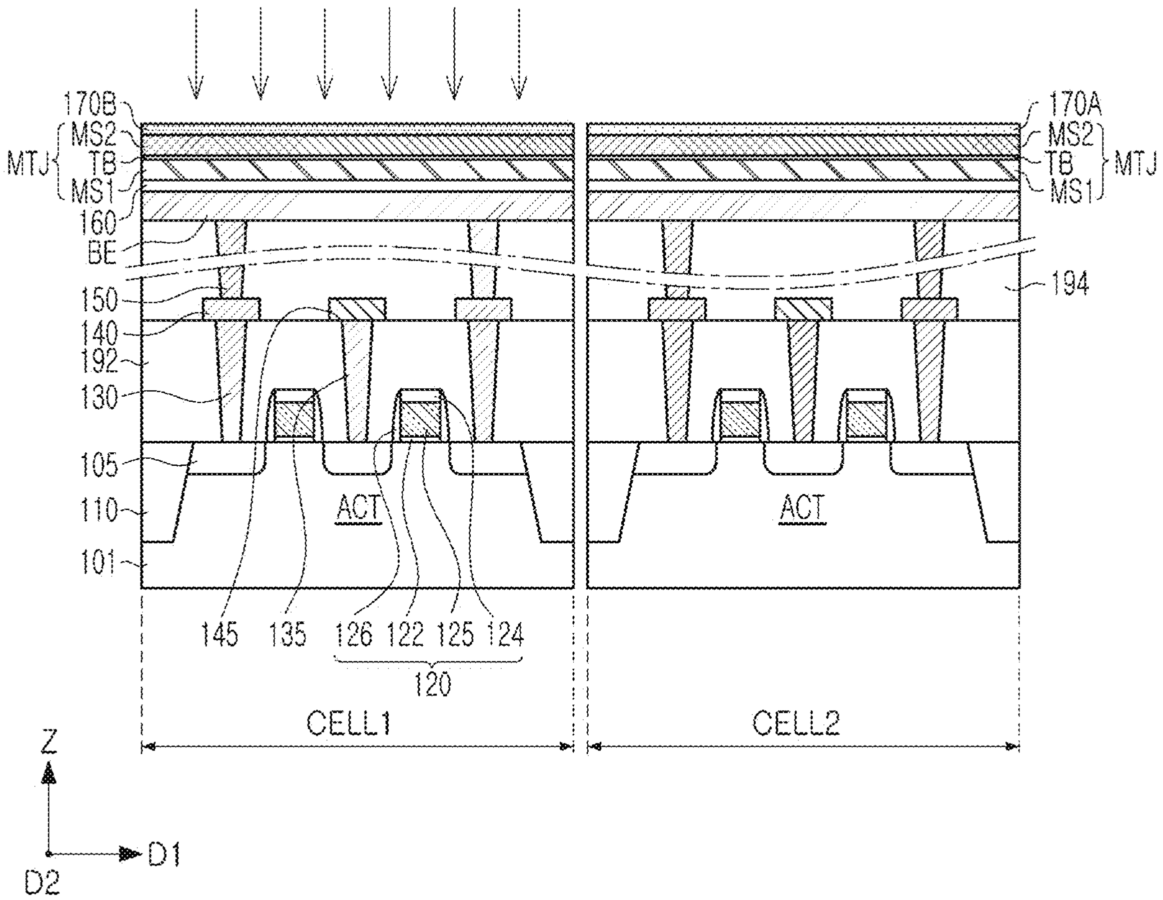

Referring to FIG. 5, FIG. 6C, and FIG. 7, a second oxidation process may be selectively performed on the first cell region CELL1 to form a second metal oxide layer 170B (S130).

The second oxidation process may be selectively performed with respect to the first cell region CELL1. The second oxidation process may be selectively performed with respect to the first cell region CELL1 without a mask. Accordingly, the second metal oxide layer 170B in which the first metal oxide layer 170A is additionally oxidized, may be formed in the first cell region CELL1. In an example embodiment, the second oxidation process may be performed in a method different from the first oxidation process. For example, the second oxidation process may include an ion implantation process, and may be performed using an ion implantation device 10 illustrated in FIG. 7.

As illustrated in FIG. 7, the ion implantation device 10 may include an ion source unit 10, a mass spectrometer 20, an acceleration tube 30, a beam scanner 40, and an end station 50. An ion beam IB provided from the ion source unit 10 may be selected while passing through the mass spectrometer 20, and may be accelerated and focused in the acceleration tube 30. The ion beam IB may be irradiated on a wafer WF disposed at an end of the end station 50. The ion beam IB may be a target disposed on the wafer WF selected by a vertical scanner 42 and a horizontal scanner 44 of the beam scanner 40. In some example embodiments, the wafer WF may be mounted on a stage or similar to move or rotate. In an example embodiment, the wafer WF may be an entire structure under manufacture including the first metal oxide layer 170A described with reference to FIG. 6B.

During the second oxidation process, an oxygen ion beam from the ion implantation device 10 may be selectively scanned in the first cell region CELL1, for example, where the second cell region CELL2 may not be scanned. A selective ion implantation may be formed in the first cell region CELL1 while the second cell region CELL2 is exposed. The second cell region CELL2 may be exposed, for example, where no mask is provided, or where the second cell region CELL2 is exposed by a mask layer. Accordingly, the second oxidation process may be performed on the first cell region CELL1 without the mask covering the second cell region CELL2, thus forming the second metal oxide layer 170B.

An oxygen concentration of the second metal oxide layer 170B may be higher than an oxygen concentration of the first metal oxide layer 170A. According to example embodiments, a second magnetic layer MS2 may also be partially oxidized at an interface with the second metal oxide layer 170B during the first oxidation process. In this operation, the magnetic tunnel junction structures MTJ may have different electrical characteristics in the first and second cell regions CELL1 and CELL2.

In an example embodiment of the present disclosure, the second metal oxide layer 170B may be formed using an ion implantation process, and may have a different distribution of an oxygen concentration from the distribution of the oxygen concentration in the first metal oxide layer 170A. For example, the first metal oxide layer 170A may have a high oxygen concentration at a surface of the first metal oxide layer 170A, that is, an upper surface thereof, and may have a concentration profile in which an oxygen concentration decreases from the upper surface toward an interior of the first metal oxide layer 170A in the Z-direction. In contrast, the second metal oxide layer 170B may have a high oxygen concentration in a region spaced apart from an upper surface of the second metal oxide layer 170B, and may have a concentration profile that decreases from the high concentration point in the Z-direction. That is, the first metal oxide layer 170A may have a peak point of the oxygen concentration at an upper surface thereof, and the second metal oxide layer 170B may have a peak point of the oxygen concentration in the region spaced apart from the upper surface thereof. For example, the metal oxide layer 170B may have a peak point of the oxygen concentration in the region below the upper surface. In some example embodiments, depending on a relative degree of oxidation in the first oxidation process and the second oxidation process, the second metal oxide layer 170B may have a first peak point of the oxygen concentration on the upper surface, and may have a second peak point of the oxygen concentration in the region spaced apart from the upper surface. An oxygen concentration at the first peak point may be greater or less than an oxygen concentration at the second peak point, and a relative size of the oxygen concentration may be variously changed in example embodiments.

The second metal oxide layer 170B may be formed without forming a mask layer, and damage to the first metal oxide layer 170A and the second magnetic tunnel junction structure MTJ2 that may occur in the second cell region CELL2 in a process of removing such a mask layer may be avoided.

Figure 6D:
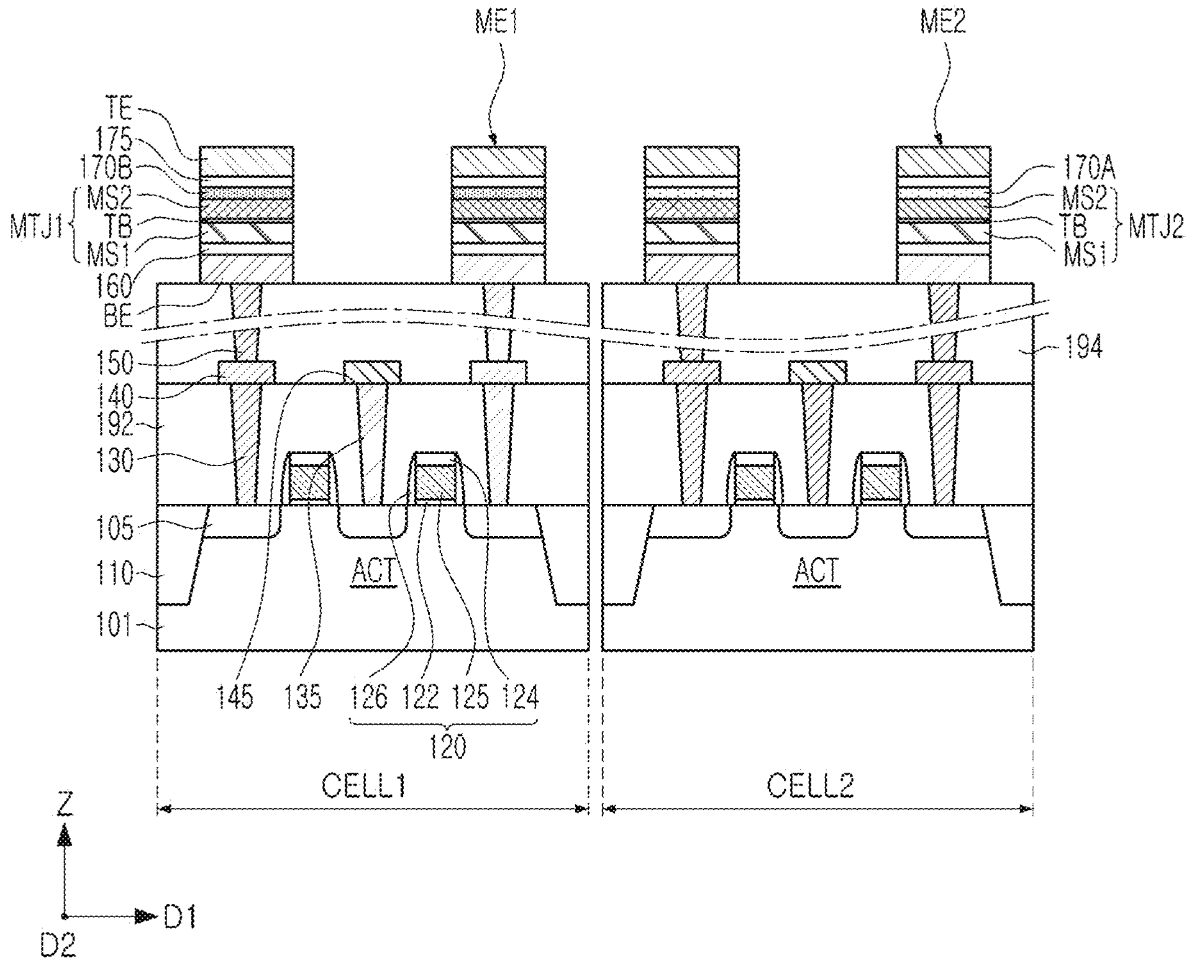

Referring to FIG. 5 and FIG. 6D, the upper electrode TE may be formed on the first and second metal oxide layers 170A and 170B (S140), and a memory structure including magnetic tunnel junction structures MTJ may be patterned (S150).

A patterning process may be performed by, for example, a dry etching process, for example, an ion beam etching process or a reactive ion etching process. Accordingly, the first and second memory elements ME1 and ME2 including the first and second magnetic junction tunnel structures MTJ1 and MTJ2, respectively, may be formed.

Referring to FIG. 2, the passivation layer 195 and the third interlayer insulating layer 196 may be formed on the second interlayer insulating layer 194 and side walls of the first and second memory elements ME1 and ME2. The bit lines 180 may be formed on the passivation layer 195, the third interlayer insulating layer 196, and the first and second memory elements ME1 and ME2, thereby manufacturing the magnetoresistive memory device 100.

Figure 8A:
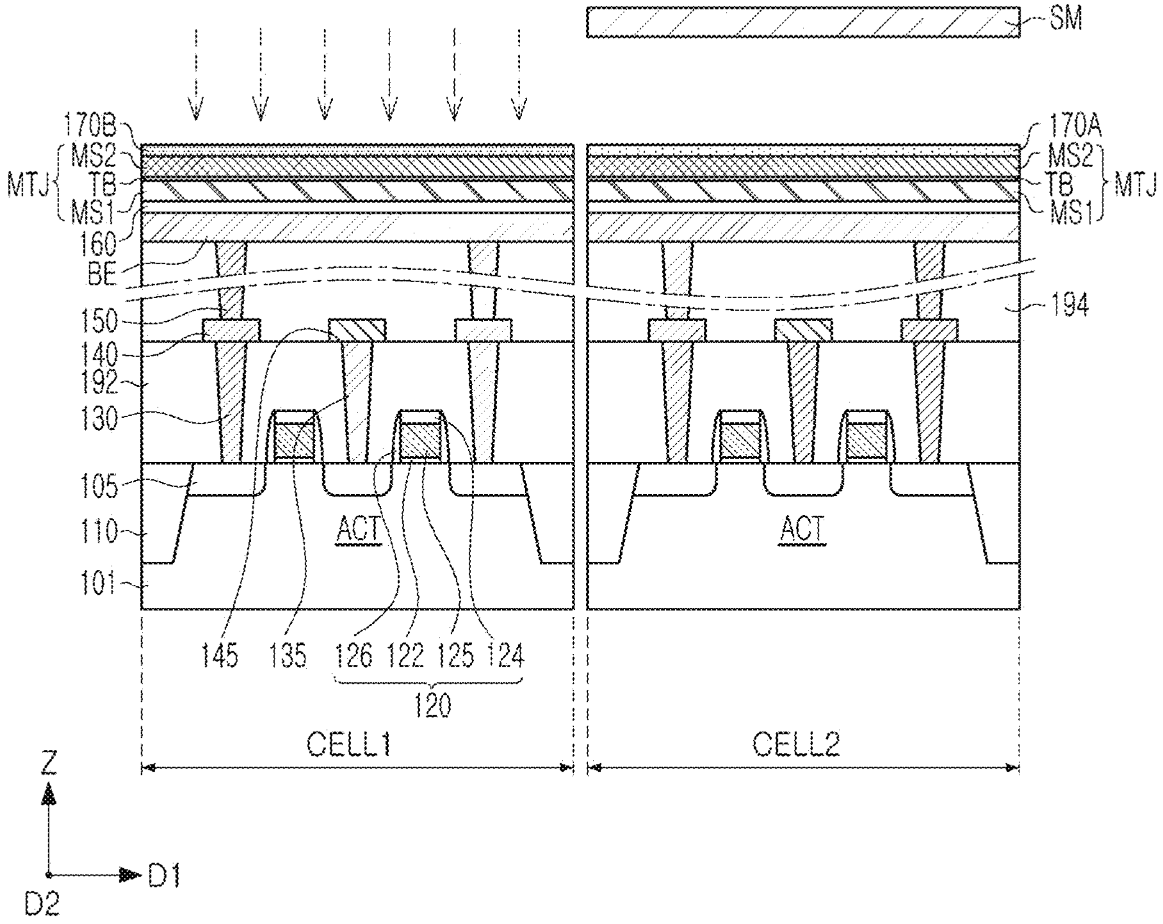
FIG. 8A is a schematic cross-sectional view illustrating a method of manufacturing a magnetoresistive memory device according to example embodiments.
Figure 8B:
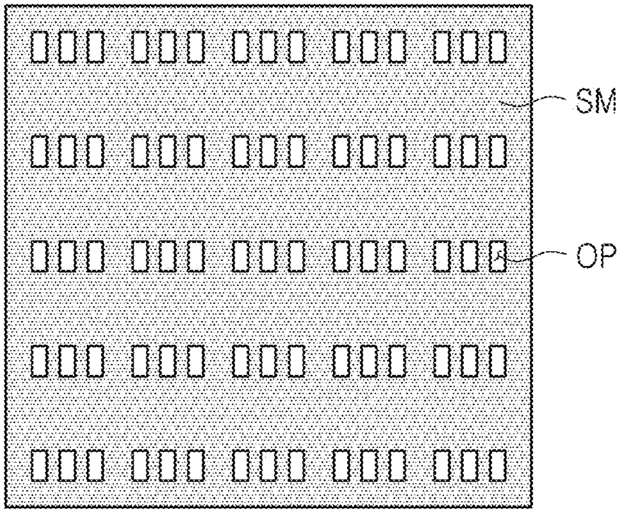
FIG. 8B is a schematic view of a shadow mask used in a method of manufacturing a magnetoresistive memory device.

FIG. 8A is a schematic cross-sectional view illustrating a method of manufacturing a magnetoresistive memory device according to example embodiments, and FIG. 8B is a schematic view of a shadow mask that may be used for a method of manufacturing a magnetoresistive memory device. FIG. 8A illustrates a region corresponding to FIG. 2.

Referring to FIG. 8A and FIG. 8B, another example embodiment of operation S130 (see FIG. 5) of forming the second metal oxide layer 170B by selectively performing the second oxidation process on the first cell region CELL1 is illustrated.

In an example embodiment, a second cell region CELL2 may be shielded using a shadow mask (SM) mounted in manufacturing a device of the magnetoresistive memory device, wherein a second oxidation process may be performed on the first cell region CELL1 and the second cell region CELL2 may be masked. The second oxidation process may be performed in a process identical to, or a process different from the first oxidation process. For example, both of the first and second oxidation processes may be performed in a thermal oxidation process.

The shadow mask SM may be mounted in equipment in which the second oxidation process is performed, for example, a chamber. As illustrated in FIG. 8B, the shadow mask SM may include openings OP exposing some regions and masking other regions, and the first cell region CELL1 may be selectively exposed by the openings OP. In example embodiments, a shape and a size of the openings OP of the shadow mask SM may be variously changed. The shadow mask SM may cover the second cell region CELL2, and a gas supplied thereto, such as oxygen, may be shielded, so that the second oxidation process may be performed in the first cell region CELL1 and the second oxidation process may not be performed in the second cell region CELL2.

In an example embodiment, the second metal oxide layer 170B may be formed without directly forming the mask layer on the first metal oxide layer 170A, and damage to the first metal oxide layer 170A and the second magnetic tunnel junction structure MTJ2 that may occur in the second cell region CELL2 in the process of removing the mask layer may be avoided.

FIGS. 9A to 9E are schematic cross-sectional views illustrating a method of manufacturing a magnetoresistive memory device according to example embodiments. FIGS. 9A to 9E are views illustrating a region corresponding to FIG. 3.

Figure 9A:
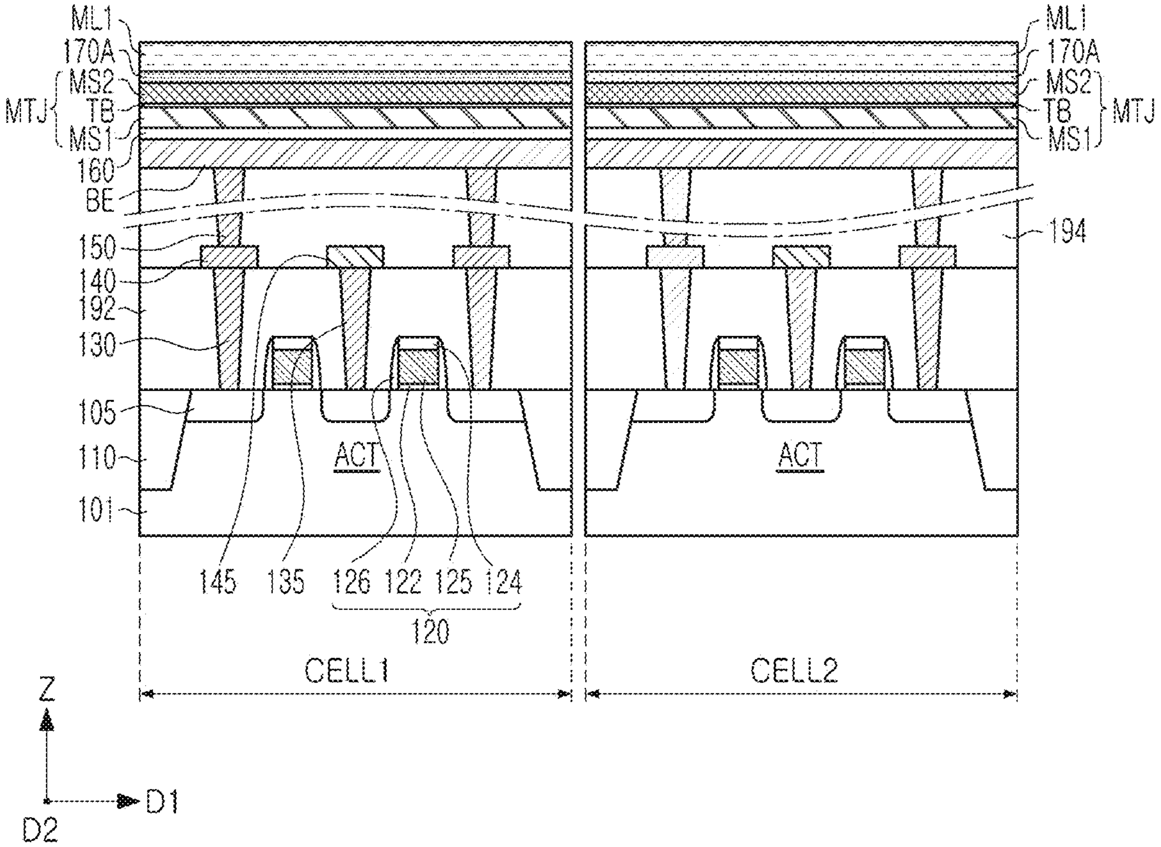
FIGS. 9A to 9E are schematic cross-sectional views illustrating a method of manufacturing a magnetoresistive memory device according to example embodiments.

Referring to FIG. 9A, the processes described with reference to FIG. 6A and FIG. 6B may be performed in substantially the same manner, and a first mask layer ML1 may be formed on a first metal oxide layer 170A in first and second cell regions CELL1 and CELL2.

The first mask layer ML1 may be a material hardened through a subsequent process, and may include, for example, a SiCN. The first mask layer ML1 may be, for example, a hard mask layer formed by a deposition process.

Figure 9B:
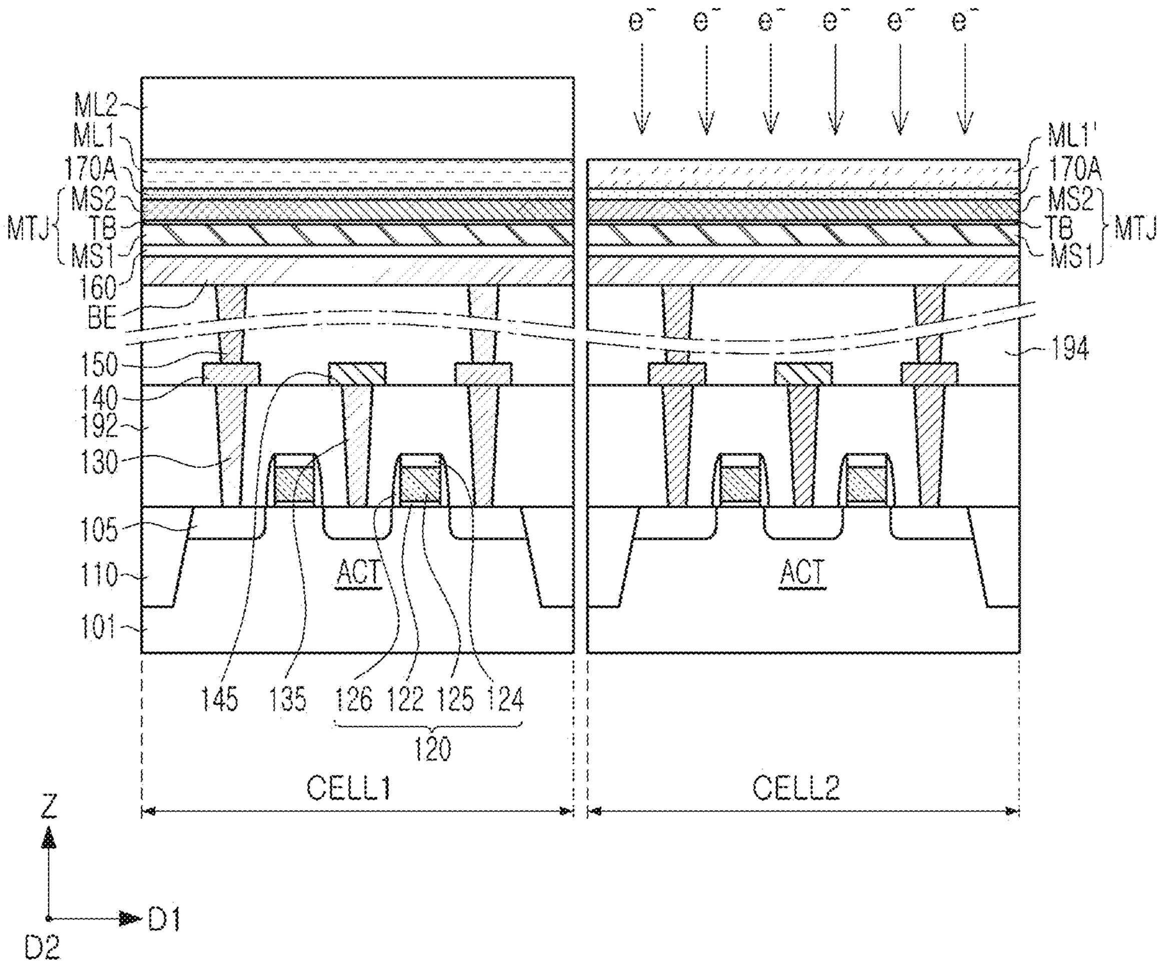

Referring to FIG. 9B, a second mask layer ML2 may be formed in the first cell region CELL1, and an electron beam may be irradiated to an exposed second cell region CELL2.

The second mask layer ML2 may be formed on the first mask layer ML1, and may be, for example, a photoresist layer. The second mask layer ML2 may be disposed on the first cell region CELL1. For example, the second mask layer ML2 may be formed to cover the first cell region CELL1 in a photolithography process and expose the second cell region CELL2.

The first mask layer ML1 of the second cell region CELL2 exposed from the second mask layer ML2 may be exposed to an electron beam. Accordingly, the first mask layer ML1 may be transformed from the first cell region CELL1 into a first mask layer ML1' that is hardened. The hardened first mask layer ML1' may have a higher strength than the first mask layer ML1, and may have, for example, a strength of about three times or more than the first mask layer ML1.

The second mask layer ML2 may be removed. The second mask layer ML2 may be removed in, for example, an ashing process and a strip process. During the process of removing the second mask layer ML2, since the first mask layer ML and the hardened first mask layer ML1' are present, the magnetic tunnel junction structures MTJ may be protected and may not be damaged.

Figure 9C:
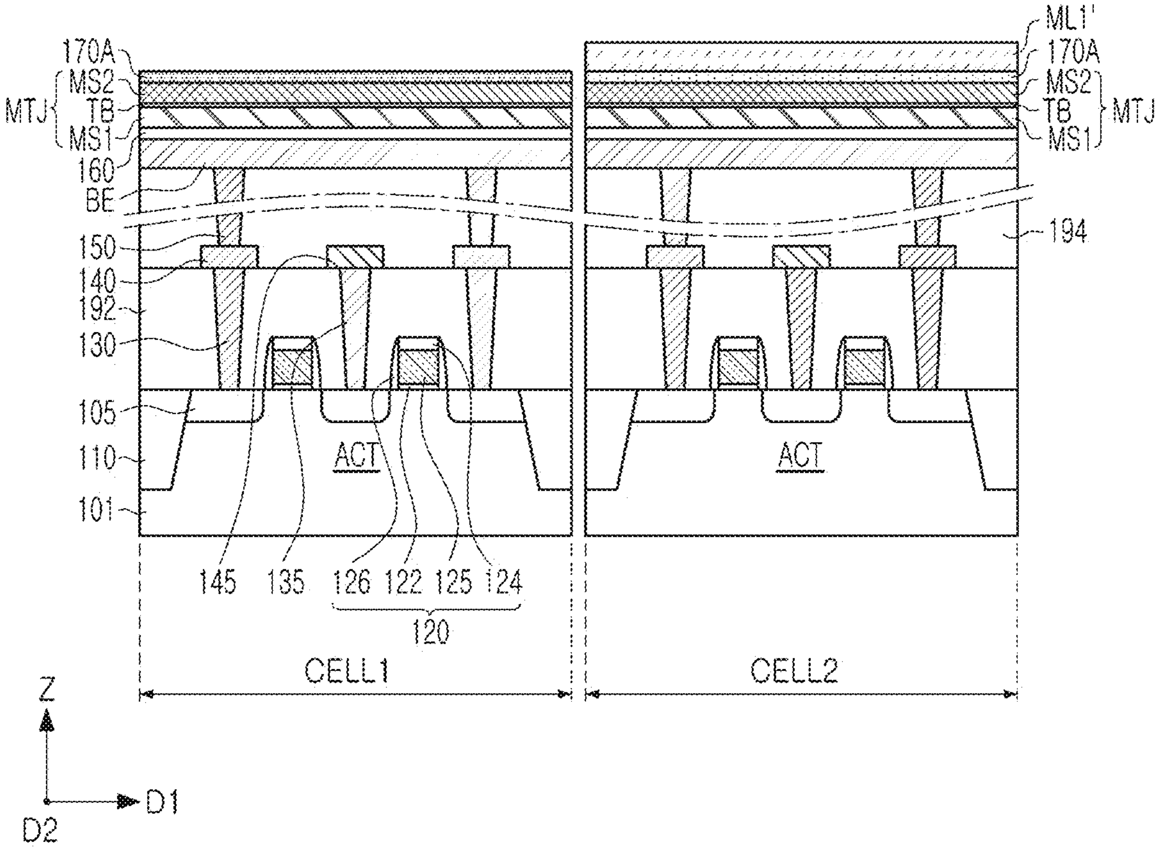

Referring to FIG. 9C, the first mask layer ML1 may be selectively removed from the first cell region CELL1.

The first mask layer ML1 may be removed in, for example, a dry etching process or a wet etching process, and the first metal oxide layer 170A may be exposed in the first cell region CELL1.

When the first mask layer ML1 is removed, the first mask layer ML1' hardened in the second cell region CELL2 may remain, and may not be removed. For example, even when the second cell region CELL2 is not covered by a mask layer, the first mask layer ML1 may be removed, and at least a portion of the first mask layer ML1' hardened in the second cell region CELL2 may remain. In some example embodiments, when the first mask layer ML1 is removed, the hardened first mask layer ML1' may be partially removed and a thickness of the hardened first mask layer ML1' may be reduced.

Figure 9D:
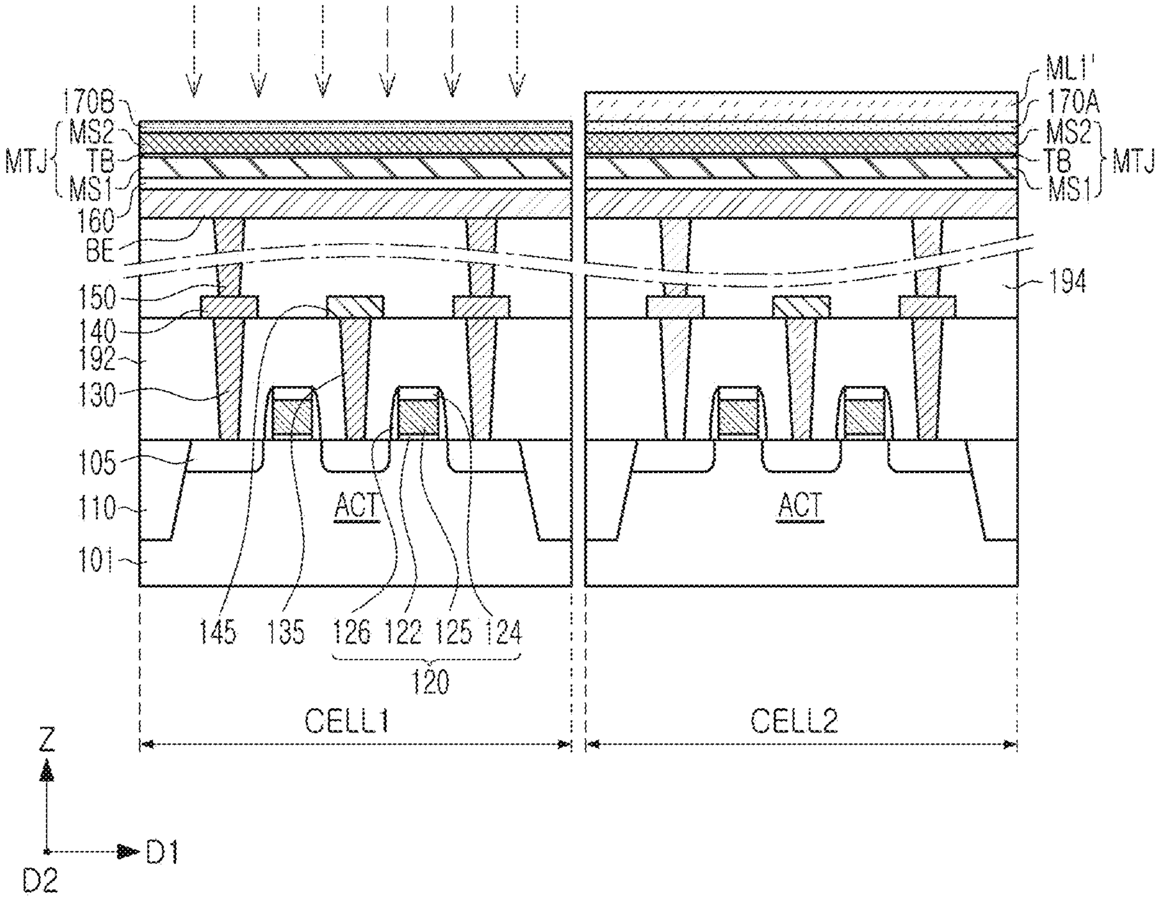

Referring to FIG. 9D, a second oxidation process may be performed to form a second metal oxide layer 170B.

The second oxidation process may be performed on the first and second cell regions CELL1 and CELL2. In the second cell region CELL2, the hardened first mask layer ML1' may be disposed on the first metal oxide layer 170A, and the first metal oxide layer 170A in the second cell region CELL2 may not be oxidized in the second oxidation process, while the first metal oxide layer 170A of the first cell region CELL1 may be additionally oxidized to form the second metal oxide layer 170B. In an example embodiment, the second oxidation process may be performed by a process identical to, or a process different from the first oxidation process.

Figure 9E:
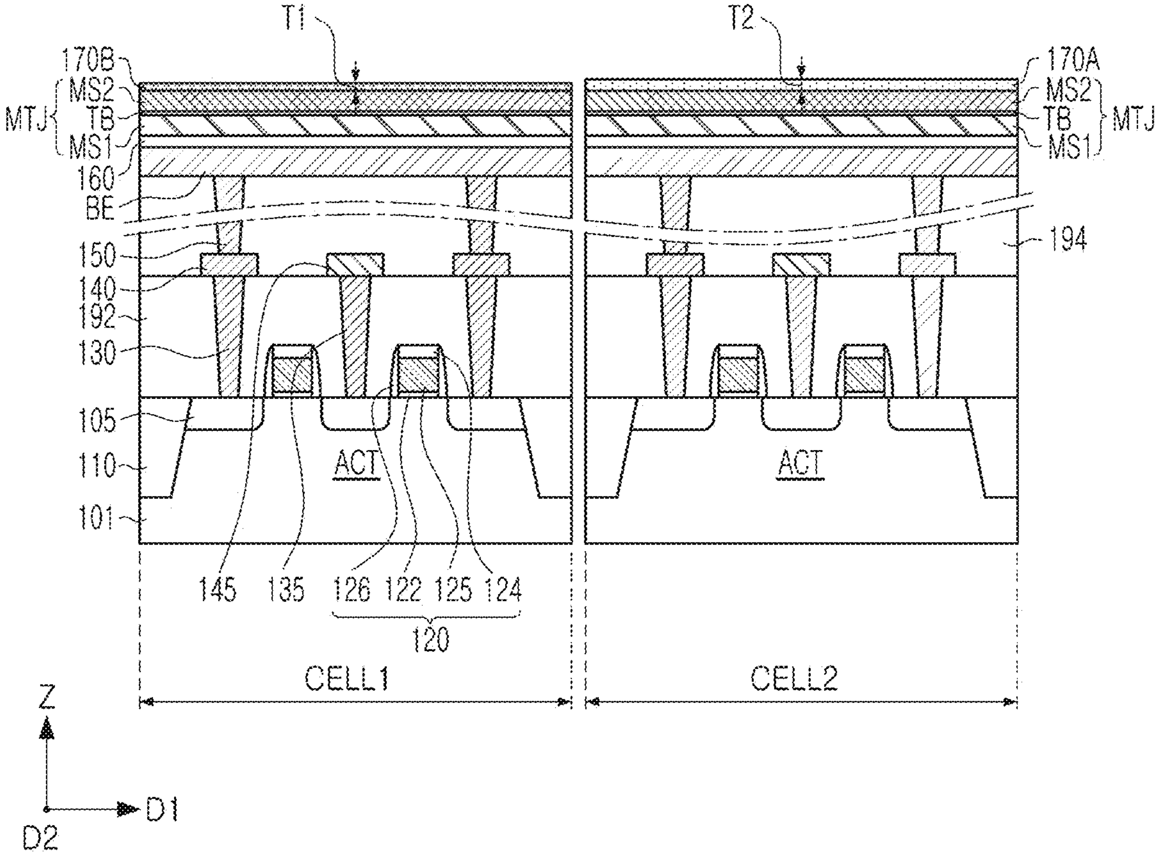

Referring to FIG. 9E, the hardened first mask layer ML1' may be removed from the second cell region CELL2.

The first mask layer ML1' may be selectively etched and removed with respect to the first and second metal oxide layers 170A and 170B. In this operation, the second metal oxide layer 170B exposed in the first cell region CELL1 may be partially removed, and a thickness of the second metal oxide layer 170B may be reduced. A first thickness T1 of the second metal oxide layer 170B may be less than a second thickness T2 of the first metal oxide layer 170A. However, in some example embodiments, the second metal oxide layer 170B may not be removed, and the first thickness T1 of the second metal oxide layer 170B may be substantially identical to the second thickness T2 of the first metal oxide layer 170A.

By performing a process in the same manner with reference to FIG. 6D and FIG. 2, the magnetoresistive memory device 100*a* of FIG. 3 may be manufactured.

In an example embodiment, the first and second mask layers ML1 and ML2 may be used when the second metal oxide layer 170B is formed, and since the magnetic tunnel junction structures MTJ are not exposed during a process, such as ashing, for removing the second mask layer ML2, the magnetic tunnel junction structures MTJ may be protected.

The present disclosure is not limited to example embodiments and the accompanying drawings. Therefore, those of ordinary skill in the art may make various replacements, modifications, or changes without departing from the scope of the present disclosure defined by the appended claims, and these replacements, modifications, or changes should be construed as being included in the scope of the present disclosure.

What is claimed is:

1. A method of manufacturing a magnetoresistive memory device, the method comprising:
- forming, sequentially, a magnetic tunnel junction structure and a metal layer on a substrate in a first cell region and a second cell region;
- performing a first oxidation process on the metal layer in the first cell region and the second cell region to form a first metal oxide layer;
- performing an ion implantation process on the first metal oxide layer in the first cell region to form a second metal oxide layer while the first metal oxide layer is exposed in the second cell region; and
- patterning the magnetic tunnel junction structure, the first metal oxide layer and the second metal oxide layer to form a first memory element including a first magnetic tunnel junction structure and the second metal oxide layer in the first cell region, and to form a second memory element including a second magnetic tunnel junction structure and the first metal oxide layer in the second cell region.

2. The method of claim 1, wherein an oxygen concentration of the second metal oxide layer is greater than an oxygen concentration of the first metal oxide layer.

3. The method of claim 1, wherein a peak point of an oxygen concentration of the second metal oxide layer is disposed in a region spaced apart from an upper surface of the second metal oxide layer.

4. The method of claim 1, wherein a peak point of an oxygen concentration of the first metal oxide layer is disposed at an upper surface of the first metal oxide layer.

5. The method of claim 1, wherein the ion implantation process comprises scanning the first cell region with an ion beam.

6. The method of claim 1, wherein the metal layer includes at least one of tantalum (Ta), ruthenium (Ru), or magnesium (Mg).

7. The method of claim 1, wherein the first oxidation process comprises a thermal oxidation process.

8. The method of claim 1, wherein the first memory element and the second memory element have different data retention characteristics and operation speeds.

9. A method of manufacturing a magnetoresistive memory device, the method comprising:
- forming, sequentially, a magnetic tunnel junction structure and a metal layer on a substrate in a first cell region and a second cell region;
- performing a first oxidation process on the metal layer in the first cell region and the second cell region to form a first metal oxide layer;
- performing a second oxidation process on the first metal oxide layer in the first cell region to form a second metal oxide layer; and
- patterning the magnetic tunnel junction structure and the first metal oxide layer and the second metal oxide layer to form a first memory element including a first magnetic tunnel junction structure and the second metal oxide layer in the first cell region, and to form a second memory element including a second magnetic tunnel junction structure and the first metal oxide layer in the second cell region,
- wherein an oxygen concentration of the first memory element is different from an oxygen concentration of the second memory element.

10. The method of claim 9, wherein the oxygen concentration of the second metal oxide layer is greater than the oxygen concentration of the first metal oxide layer.

11. The method of claim 9, wherein the first memory element and the second memory element have different electrical characteristics.

12. The method of claim 9, wherein the first oxidation process comprises a thermal oxidation process, and the second oxidation process comprises an ion implantation process.

13. The method of claim 9, wherein performing the second oxidation process comprises:
- shielding the second cell region using a shadow mask mounted to equipment for performing the second oxidation process.

14. The method of claim 9, wherein performing the second oxidation process comprises forming a hardened first mask layer exposing the first metal oxide layer in the first cell region.

15. The method of claim 9, wherein performing the second oxidation process comprises:
- forming a first mask layer on the first metal oxide layer in the first cell region and the second cell region;
- forming a second mask layer exposing the second cell region on the first mask layer;
- forming a hardened first mask layer by irradiating an electron beam to the first mask layer exposed in the second cell region;
- removing the second mask layer;
- removing the first mask layer from the first cell region;
- performing the second oxidation process; and
- removing the hardened first mask layer from the second cell region.

16. The method of claim 15, wherein the first mask layer includes a SiCN.

17. The method of claim 9, wherein a thickness of the second metal oxide layer is smaller than a thickness of the first metal oxide layer.

18. A method of manufacturing a magnetoresistive memory device, the method comprising:
- forming, sequentially, a magnetic tunnel junction structure and a metal layer on a substrate in a first cell region and a second cell region;
- performing a first oxidation process on the first cell region and the second cell region;

performing, selectively, a second oxidation process on the first cell region; and patterning the magnetic tunnel junction structure to form a first magnetic tunnel junction structure in the first cell region and form a second magnetic tunnel junction structure in the second cell region, wherein a first memory element, formed in the first cell region and including the first magnetic tunnel junction structure, and a second memory element, formed in the second cell region and including the second magnetic tunnel junction structure, have different electrical characteristics.

19. The method of claim 18, wherein the second oxidation process is performed without a mask.

20. The method of claim 18, wherein the electrical characteristics of first memory element and the second memory element include at least one of different data retention characteristics or different operation speeds.

* * * * *